United States Patent [19]

Thomson

[11] Patent Number: 5,559,514
[45] Date of Patent: Sep. 24, 1996

[54] ANALOG-TO-DIGITAL CONVERTER WITH SIGMA-DELTA DUTY CYCLE ENCODED OUTPUT

[75] Inventor: David Thomson, Fremont, Calif.

[73] Assignee: Analog Devices, Inc., Norwood, Mass.

[21] Appl. No.: 287,664

[22] Filed: Aug. 9, 1994

Related U.S. Application Data

[63] Continuation-in-part of Ser. No. 54,556, Apr. 27, 1993, abandoned.

[51] Int. Cl.⁶ .............................. H03M 3/02; H03M 1/60
[52] U.S. Cl. ............................................. 341/143; 341/157
[58] Field of Search ...................................... 341/143, 157, 341/163, 164, 165

[56] References Cited

U.S. PATENT DOCUMENTS

| | | |
|---|---|---|
| 3,731,072 | 5/1973 | Johnston ................................... 341/143 |
| 3,879,663 | 4/1975 | McGrogan, Jr. ......................... 341/143 |
| 5,245,343 | 9/1993 | Greenwood et al. .................... 341/143 |

OTHER PUBLICATIONS

Transducer Interfacing Handbook–A Guide to Analog Signal Conditioning, ed. by D. Sheingold, Analog Devices, Inc., 1981, pp. 125–126.

Electronics Engineers' Handbook, Ed. by Fink et al., McGraw–Hill Book Company, 3d Ed. 1989, pp. 14.39–14.41.

Sedra et al., Microelectronic Circuits, Holt, Reinhart and Winston, 1987, pp. 890–894.

Sarhang-Nejad, "Realization of a High–Resolution Multibit ΣΔ Analog-Digital Converter", Ph.D. Dissertation, University of California at Los Angeles, 1991.

Taub, et al., Digital Integrated Circuits, McGraw–Hill, 1977, pp. 322–355.

Primary Examiner—Howard L. Williams
Attorney, Agent, or Firm—Koppel & Jacobs

[57] ABSTRACT

An analog-to-digital converter employs a sigma-delta modulator that produces a pulsed output with an average duty cycle that varies with an analog input to the modulator. A counter averages the modulator's output duty cycle, and feeds the averaged information onto a one-line transmission circuit for delivery to a remote location. Both the sigma-delta modulator and the counter are synchronized to the same local clock, so that the counter's duty cycle remains substantially constant even if the clock frequency varies. This allows for a simple clock configuration that can be integrated along with the sigma-delta modulator and counter on a single IC chip of reasonable size. When used for temperature sensing, the counter's output duty cycle provides an indication of the locally sensed temperature, independent of temperature-induced variations in the clock frequency.

16 Claims, 2 Drawing Sheets

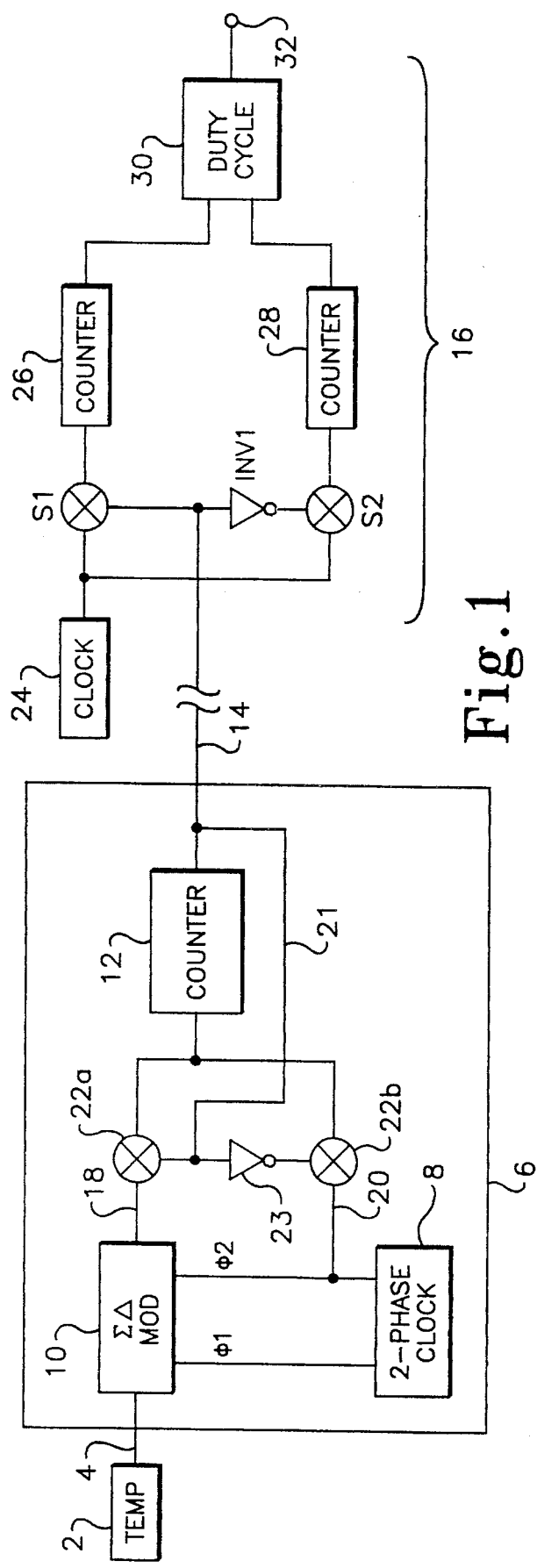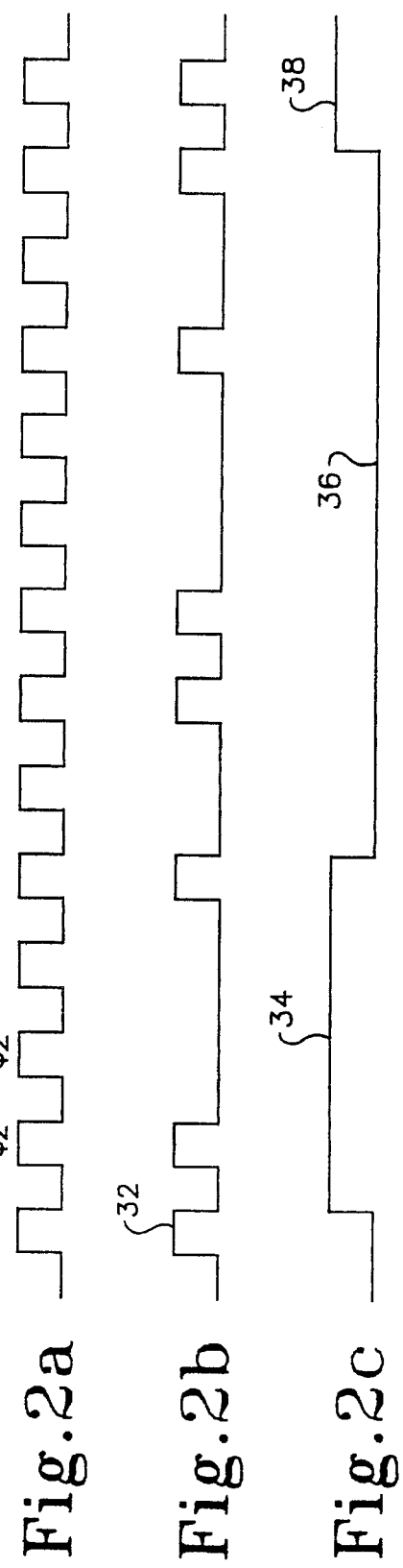
Fig.1
Fig.2a
Fig.2b
Fig.2c 5,559,514

ANALOG-TO-DIGITAL CONVERTER WITH SIGMA-DELTA DUTY CYCLE ENCODED OUTPUT

This application is a continuation-in-part of U.S. application Ser. No. 08/054,556, filed Apr. 27, 1993, now abandoned.

BACKGROUND OF THE INVENTION

1. Field of the Invention

This invention relates to analog-to-digital converters (ADCs), and more particularly to ADCs which employ a sigma-delta modulator in the conversion circuit.

2. Description of the Related Art

There is a need for a single-wire system that can be used for the remote sensing of phenomena such as temperature, with only a small integrated circuit (IC) chip. The chip should be able to convert an analog representation of the sensed phenomenon to a digital signal, for transmission to a remote location over the single line. The conventional method for deriving a digital representation of a temperature signal involves the use of a discrete temperature-to-voltage transducer, followed by a voltage-to-frequency converter (VFC), with the frequency output interpreted by a microcontroller or counter circuit that is at a remote location from the temperature sensor. This type of system is described in *Transducer Interfacing Handbook—A Guide to Analog Signal Conditioning*, ed. by D. Sheingold, Analog Devices, Inc., 1981, pages 125–126. The VFC typically includes a voltage reference and an off-chip resistor/capacitor network to achieve a time reference that is insensitive to temperature changes. Typical capacitor sizes are in the tens of nanofarads, which is too large to implement on a practical IC chip.

Sigma-delta modulators can also be used for an analog-digital conversion. Such modulators produce an output pulse stream in which the pulse density is proportional to the input signal, and are described in general in *Electronics Engineers' Handbook*, Ed. by Fink et al., McGraw-Hill Book Company, 3d Ed. 1989, pages 14.39–14.41. However, sigma-delta modulators require a clock, and it is impractical to design an on-chip clock with a small enough frequency variation over temperature to be used as a time reference for temperature sensing. If the clock is to be integrated on the same small chip with the remainder of the modulator, two output lines must be provided: one for the modulator output, and one for the clock signal for use in synchronizing the decoding of the modulator output at the receiver. But, as stated above, a single-line output would be highly desirable.

A modified sigma-delta modulator circuit is described in Sarhang-Nejad, "Realization of a High-Resolution Multibit ΣΔ Analog-Digital Converter", Ph.D. Dissertation, University of California at Los Angeles, 1991. This circuit adds two counters to a conventional sigma-delta modulator. The first counter counts up the output pulses from the modulator, while the second counter counts up to full scale and stops the first counter after a preset time period. The count which the first counter has reached at the time it is stopped is taken as a representation of the analog input to the modulator, and is transmitted as a digital word. The second counter is used to both operate the sigma-delta modulator, and to freeze the first counter's count at the end of the preset time period. While this circuit operates with a one-line output, the area occupied by the two counters is too large to integrate the entire circuit on a single practical chip.

SUMMARY OF THE INVENTION

The present invention seeks to provide an ADC whose output is independent of variations in its clock frequency, which has a one-line output, and which is small enough to be readily integrated on a single IC chip.

These goals are achieved by basing the output digital signal upon the duty cycle, rather than the absolute value, of the output from a sigma-delta modulator that receives the input analog signal. The duty cycle of the modulator's output is averaged to generate an output signal that corresponds to the input analog signal. Both the sigma-delta modulator and the duty cycle averaging circuit are synchronized to the same clock, so that variations in the clock frequency do not affect the duty cycle of the ultimate output signal.

In a preferred embodiment, a two-phase clock circuit is used to clock both the sigma-delta modulator and, on a multiplexed basis, an input to a counter; the counter input is multiplexed between the clock and the modulator output. The input to which the counter responds is alternated each time its count reaches a predetermined amount. Thus, in one state the counter counts up at the clock rate, while in its other state the counter counts up at a rate that corresponds to the average duty cycle of the sigma-delta modulator output. The two counter output states establish a duty cycle that corresponds to the average of the sigma-delta modulator duty cycle; this signal is suitable for a one-line output. The clock circuit, sigma-delta modulator and counter circuit are all integrated together on a common IC chip.

These and other features and advantages of the invention will be apparent to those skilled in the art from the following detailed description, taken together with the accompanying drawings.

BRIEF DESCRIPTION OF THE DRAWINGS

FIG. 1 is a block diagram of an ADC in accordance with the invention, together with a remote circuit for receiving the ADC's output;

FIGS. 2a, 2b and 2c are signal traces of the outputs from the clock, sigma-delta modulator and counter of FIG. 1, respectively;

DETAILED DESCRIPTION OF THE INVENTION

Figure 3:
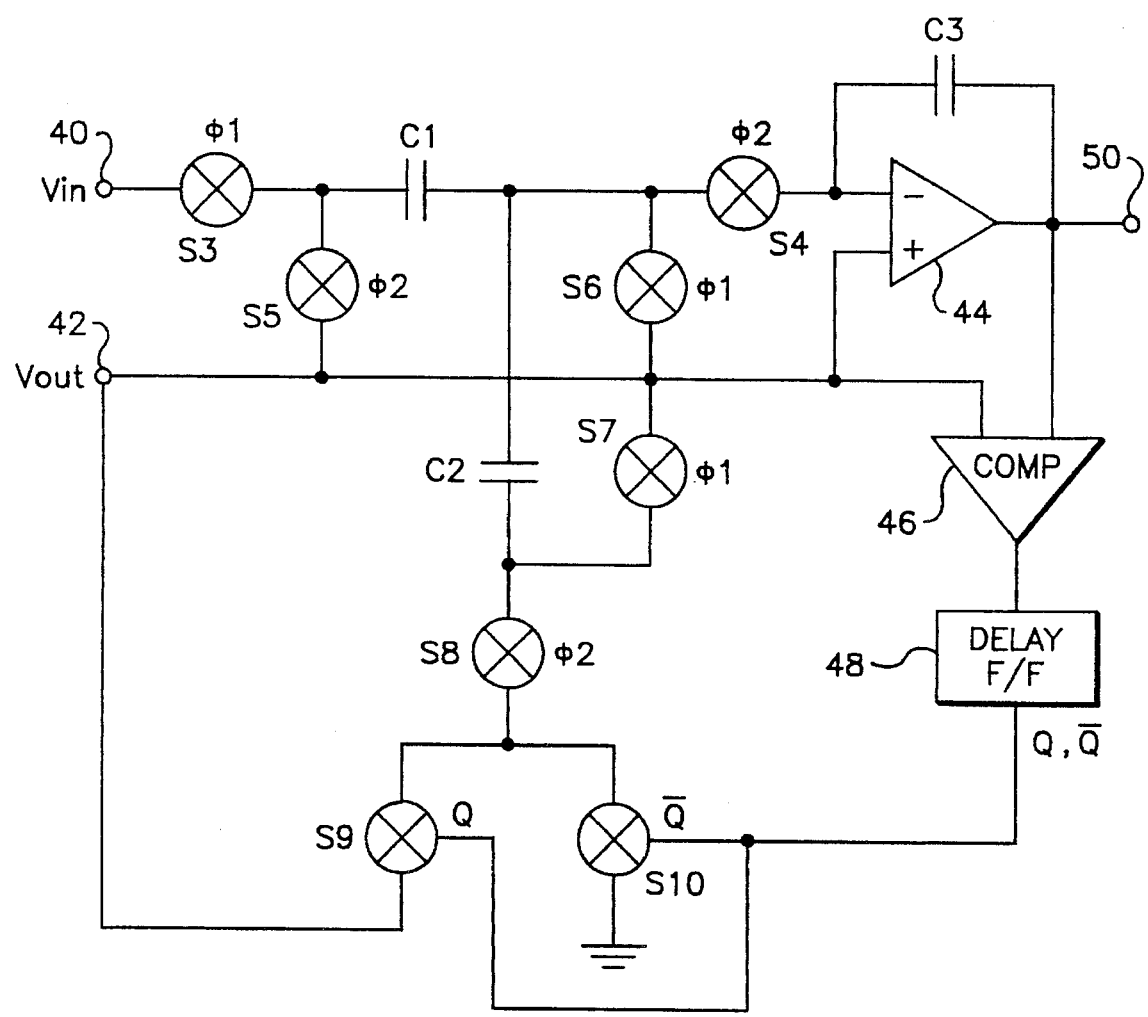
FIG. 3 is a schematic diagram of a sigma-delta modulator circuit that can be used in the overall circuit of FIG. 1.

FIG. 1 is a block diagram illustrating the application of the invention to a temperature sensing system, in which a sensed temperature is converted to a digital signal and delivered over a one-line transmission system to a remote receiver. While this is an important use for the invention, it is applicable in general to the conversion of any analog signal to digital format.

A temperature sensor 2 produces an electrical analog output on line 4 that corresponds to the sensed temperature. The sensor may be of any conventional design which transduces temperature to an electrical analog output. The ADC of the invention is shown integrated on a single IC chip 6, which in the case of the TMP03 temperature sensor by Analog Devices, Inc., the assignee of the present invention, is expected to be approximately 1.7 mm×1.45 mm. The chip size for different applications can vary widely.

The ADC has three principal sections: a 2-phase clock 8 that generates complimentary output clock signals φ1 and φ2, a sigma-delta modulator 10 that is clocked by the complementary clock signals, and a dual-input counter circuit 12. For purposes of illustration the counter 12 is assumed to be a 13-bit device, but its actual size would depend upon the required degree of resolution. Each of these three major components can be of conventional design, but when integrated as described herein they produce an output digital signal over a single output line 14 that is insensitive to temperature variations in the clock frequency.

A remote receiver, indicated collectively by numeral 16, is connected to the opposite end of the transmission line 14 to convert the transmitted digital signal back to analog format. A suitable receiver circuit configuration will be described after discussing the ADC in more detail.

The 2-phase clock 8 typically has a nominal output frequency of 1 MHz, although this can be varied considerably if desired. The clock is exposed to the same temperature as the temperature sensor 2, causing its actual frequency to vary somewhat as the temperature changes. Although clock designs have been developed with very low frequency variations over temperature, such circuits generally require a greater area than can be accommodated on a small IC chip together with the other elements of the ADC. Accordingly, the present design employs a simple clock without temperature compensation, but utilizes the output from the sigma-delta modulator 10 in such a way that it is substantially independent of temperature-induced shifts in the clock frequency.

Since the operation of the sigma-delta modulator 10 is synchronized to the clock output, the frequency of the modulator output will also vary with temperature. However, the duty cycle of the modulator output is substantially independent of temperature variations. This is because the duration of both the modulator's output pulses, and of the spaces between pulses, will vary in direct proportion to the clock period. Thus, although the modulator's output frequency is temperature dependent, the output duty cycle (the percentage of the total output time that is occupied by active pulses) is substantially temperature-independent. The invention makes use of this phenomenon to implement an analog-to-digital conversion that is substantially temperature invariant, even though the frequency of its synchronizing clock does vary with temperature.

At any given time the counter 12 receives either the pulsed output from the sigma-delta modulator 10 over line 18, or the φ2 clock output over line 20. The counter output is taken from its most significant bit (MSB) and is tied back via line 21 to a 2:1 multiplexer that is incorporated into the counter input. The multiplexer preferably includes a pair of switches 22a and 22b, with switch 22a connecting the counter input to line 18 and switch 22b connecting the counter input to line 20. Counter output line 21 is connected directly to the control for switch 22a, and through an inverter 23 to the control for switch 22b.

The logic state of the counter's MSB operates the multiplexer to determine which input is applied to the counter at a particular time. For example, with a logic high on the MSB, switch 22a is closed and switch 22b is open; this causes the counter to count up at the rate of the on-chip clock 8. A logic low on the MSB closes switch 22b and opens switch 22a, causing the counter to count up at a rate determined by the pulse output rate of the sigma-delta modulator 10. Since the sigma-delta modulator is itself synchronized to the clock, the clock 8, modulator 10 and counter 12 all operate in the same time regime. If the clock frequency shifts because of temperature changes, the output pulse widths of both the sigma-delta modulator and the counter will experience a similar shift. However, the duty cycle of both the modulator and counter outputs will remain substantially constant, since the periods of logic highs and logic lows will be stretched or contracted in the same proportion.

While the output duty cycle from the modulator 10 can vary considerably at any given time for a particular analog input, its average duty cycle over a reasonably large number of periods will vary in a direct correspondence with the magnitude of the input analog signal. The counter 12 averages the sigma-delta modulator's output duty cycle over a period determined by the number of counter bits. For example, a 13-bit counter will count up to 4,096 ($2^{12}$) before the MSB changes state; this will take approximately 4 msec at a 1 MHz clock rate. When the counter is operated by its modulator input 18 rather than the clock input 20, however, it will count up more slowly because the modulator's duty cycle will be less than that of the clock. Regardless of how long it takes, the counter will count up over 4,096 output pulses of the sigma-delta modulator, and will thus produce an averaged duty cycle output over that many modulator periods. Averaging over 4,096 pulses yields a counter output that accurately reflects the input temperature signal.

Numerous receiver circuits can be envisioned for detecting the duty cycle of the counter output. In the circuit indicated by number 16, the output of a remote clock circuit 24 is connected through switches S1 and S2 to remote counters 26 and 28, respectively. The signal on the transmission line 14 is applied directly to the first switch S1, and through an inverting circuit INV1 to switch S2, such that S1 is closed and S2 is open when the signal on line 14 is a logic high, and S1 is open with S2 closed when the signal on line 14 is a logic low. Thus, counter 26 counts up at the output frequency of clock 24 during the logic high portions of the ADC output, while counter 28 counts up at the same frequency during the logic low portions of the ADC output. A comparison between the counts accumulated by these two counters will thus give the duty cycle of the ADC output on line 14. Any convenient circuit 30 may be employed to perform this calculation and produce an analog output on output terminal 32 whose magnitude corresponds to the temperature detected by sensor 2.

The signal patterns produced at the outputs of the clock 8, sigma-delta modulator 10 and counter 12 are illustrated in FIGS. 2a–2c, respectively. For ease of illustration, it is assumed that the counter 12 changes state upon reaching a count of 4, rather than 4,096. In FIG. 2a only the φ2 clock output is shown, consisting of a series of logic high pulses and intervening logic low periods that are all of substantially equal duration. The φ1 output is simply the complement of φ2 without overlap. Since the clock will have a logic high output at all times, alternating between φ1 and φ2, it can be said to have an overall duty cycle of essentially 100%. However, the duty cycle of either output phase is 50%.

Assume now that the temperature sensor 2 provides an analog input to the sigma-delta modulator 10 such that the modulator produces an output characterized, on the average, by one logic high pulse of unit duration for each three unit durations of a logic low state. This output is illustrated in FIG. 2b. It can be seen that the pulsed output from the modulator is not absolutely periodic, but averages to one logic high period for every three logic low periods. Thus, the sigma-delta modulator's duty cycle can be taken as 25%. Higher sensed temperatures would produce a greater analog input to the modulator and a correspondingly greater duty cycle, and vice versa for lower sensed temperatures. For the particular sigma-delta modulator described below, the maximum duty cycle is 50%.

FIG. 2c shows the resulting output from the counter 12. Assume that the first modulator output pulse 32 causes the counter to shift to its clock input from line 20, and to assume a high output state. This initiates the logic high counter output pulse 34, which lasts for four φ2 clock pulses until the counter's MSB shifts its state and the counter output drops low. At the same time, the input to the counter shifts from the clock to the sigma-delta modulator along line 18. This begins a low counter output state 36 that lasts until four modulator pulses have been received. As the input analog signal to the modulator goes down, the spaces between the modulator's output pulses will increase. This causes the time necessary to generate four modulator output pulses to also go up, and thereby lengthen the counter's logic low period 36. After four modulator pulses have been received, the counter reverts back to a high output state 38, and again counts up under the φ2 clock input until four more clock pulses have been received.

It can thus be seen that the duty cycle of the counter output corresponds to the sensed temperature, with the counter averaging the duty cycle of the sigma-delta modulator. When the counter capacity is large enough to average a significant number of modulator cycles, such as 4,096, a counter output that accurately represents the sensed temperature can be obtained. Any variation in the clock frequency will effect the durations of the clock high and low output states equally, and will thus vary the durations of the high and low output states from both the sigma-delta modulator and the counter in equal proportions. Thus, although the absolute duration of the counter's high and low output states may vary, their relative durations and the consequent duty cycle will remain substantially constant.

In FIGS. 2a–2c the counter output is shown as assuming a high logic state when the counter is operating under its clock input 20, and a low output state when the counter is operating under its modulator input 18. With this arrangement, the counter's duty cycle will go up as the sensed temperature increases, and will drop as the sensed temperature goes down. Alternately, the counter's logic state could be set to go low under the clock input and high under the modulator input. In this case, the counter's duty cycle would drop as the sensed temperature went up, and increase as the sensed temperature went down. However, there would still be a one-to-one correspondence between the counter duty cycle and the sensed temperature, and the remote receiver would be programmed to decode whatever particular relationship is established between temperature and counter duty cycle.

Conventional clock and counter circuits can be used for the invention, such as those described respectively in Sedra et al., *Microelectronic Circuits*, Holt, Rhinehart and Winston, 1987, pages 890–894, and Taub et al., *Digital Integrated Circuits*, McGraw-Hill, 1977, pages 322–355. A schematic diagram of a conventional sigma-delta modulator circuit that can be used is shown in FIG. 3. In this diagram, switches that are closed in response to a high logic state at the clock's φ1 and φ2 outputs are indicated by the legends φ1 and φ2, respectively.

The temperature signal Vin, which in the example shown is a voltage that is generally proportional to temperature in the range of about 0–5 volts, is delivered to an input terminal 40 in the modulator circuit. A reference terminal 42 is held at a reference voltage Vref, such as 5 volts. The input terminal 40 is connected via a φ1 switch S3, capacitor C1 and φ2 switch S4 to the inverting input of an operational amplifier (op amp) 44, while the reference terminal 42 is connected directly to the op amp's non-inverting input. A φ2 switch S5 connects the input and reference lines on the input side of C1, while a φ1 switch S6 connects these two lines on the opposite side of C1. Another capacitor C2 is tapped off the input line immediately after C1, and is shunted by the combination of switch S6, and another φ1 switch S7 that is connected between the reference line and the opposite side of C2. An integrating capacitor C3 is connected between the output of op amp 44 and its inverting input, with the op amp's output and the reference line 47 also connected to respective inputs of a comparator 46. The output of comparator 46 in turn is connected to trigger a delayed flip-flop circuit 48, which has complementary outputs Q and $\overline{Q}$. The opposite side of capacitor C2 from the input line is connected via a φ2 switch S8 to a differential switch network that consists of switches S9 and S10; these two switches are respectively gated into conduction by Q and $\overline{Q}$ signals from the flip-flop circuit 48. Switch S9 connects S8 to the reference terminal 42 when it is closed, while switch S10 when closed connects S8 to a ground reference.

The output from the sigma-delta modulator circuit is taken from the op amp output at terminal 50. The modulator's operation is as follows: during φ1, also referred to as the precharge cycle, a charge equal to the product of C1 and (Vin-Vref) is placed on capacitor C1 by virtue of switches S3 and S6 being closed. During the precharge cycle capacitor C2 is set to hold zero charge by virtue of switches S6 and S7 being closed to short circuit the capacitor. The common connection of C1 and C2 serves as a differencing node for the fedback charge.

There is preferably a short interval between φ1 and φ2, to assure that these switching periods do not overlap. During this interval, all switches are open and the charges acquired during φ1 are held. Then, during the φ2 integration cycle, C2 acquires a charge that depends upon the previous state of flip-flop 48. For a Q flip-flop output state, switches S8 and S9 are closed and C2 acquires a zero charge (the opposite side of C2 from S8 is connected via S4 to the inverting input of opamp 44, but the opamp's action is to hold the voltages of both of its inputs at essentially the same level, so that both sides of C2 are in essence connected to Vref). For a $\overline{Q}$ flip-flop output, S8 and S10 are closed and C2 acquires a charge equal to the product of C2 and Vref. During the integration cycle, a charge equal to that stored on C1 minus the charge acquired by C2 is transferred to the integrating capacitor C3 because switches S4 and S5 are closed. The op amp 44 acts to keep the common connection of C1/C2 at Vref when S4 is closed, and ensures that the charge difference of Q(C1)–Q(C2) is transferred to C3 during φ2. The differencing node at the common connection of C1 and C2 serves as the "Δ", while the integrating capacitor C3 serves as the "Σ" in the "ΣΔ" modulator.

As a specific example, assume that Vin is 3.5 V, Vref is 2.5 V, C1=C2=5pF and C3=10pF. With these parameters the charge transferred to C3 is 5pC during the Q output state of flip-flop 48 and 5pC–12.5pC=–7.5pC during $\overline{Q}$. Since C3=10pF, the integrator will step 0.5 V for Q, or –7.5 V for $\overline{Q}$.

Figure 4:
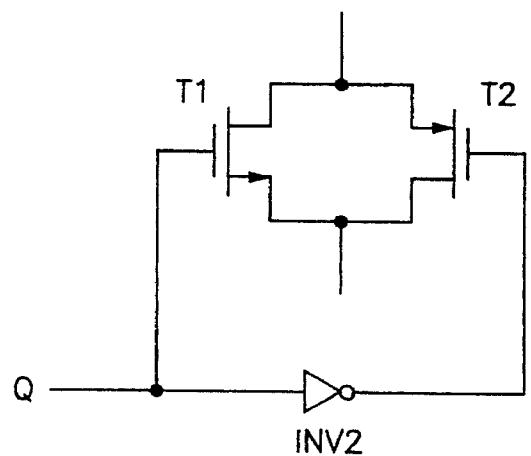
FIG. 4 is a schematic diagram of a switch circuit that can be used in the sigma-delta modulator of FIG. 2.

FIG. 3 shows only one sigma-delta modulator circuit that could be used. Other available circuits could also be employed, so long as they produced an output duty cycle that varied according to a fixed relationship with the input analog temperature signal. Numerous different switch circuits could also be employed within the modulator and for the multiplexer switches 22*a* and 22*b*, such as simple field effect transistors (FETs). The use of a n-channel FET T1 and a p-channel FET T2 to implement such a switch is illustrated in FIG. 4. The switch control signal Q is applied directly to the gate of the n-channel device T1, and through an inverter INV2 to the gate of the p-channel device T2. The switch will thus be ON when a Q switch control is applied, and OFF when Q is low during $\overline{Q}$.

It would conceptually be possible to provide a direct output from the sigma-delta modulator 10 to the transmission line 14, with the average duty cycle calculation performed within the remote receiver 16. However, this would require the sigma-delta modulator output to be used to gate an asynchronous clock in the remote circuit. The result would be to add significantly to the overall complexity, and significant errors would be introduced unless the frequency of the asynchronous clock were many times greater than that of the clock 8 that resides on the sigma-delta modulator chip. Alternately, the output of clock 8 could be transmitted along with the sigma-delta modulator output to the remote location, but that would require a two-line transmission system which the invention specifically seeks to avoid. With the sigma-delta modulator 10 and counter 12 both synchronized to the local clock 8, however, the above errors can be avoided in a system in which all local processing circuitry is integrated on a single IC chip, with only a one-line transmission required to deliver an accurate temperature signal to a remote location. The counter's output will generally be a voltage signal; although a current signal could be produced instead, it would increase the circuit's cost without much accompanying benefit.

While a particular embodiment of the invention has been shown and described, numerous alternate embodiments will occur to those skilled in the art. Accordingly, it is intended that the invention be limited only in terms of the appended claims.

I claim:

1. An analog-to-digital converter (ADC), comprising:

a clock having a frequency output that can vary with temperature, and a modulating circuit connected to receive an input analog signal and to operate in response to said clock output, said modulating circuit producing a digital output with a duty cycle that corresponds to an input analog signal generally independent of the clock frequency, said modulating circuit comprising a sigma-delta modulator which receives said input analog signal, and an output circuit which responds to said sigma-delta modulator and to said clock output to produce said digital output, wherein said clock output and an output signal from said sigma-delta modulator are selectively applied one-at-a-time as inputs to said output circuit.

2. The ADC of claim 1, further comprising a receiver connected to receive and convert said digital output to a reception signal having an output that varies with the duty cycle of said digital output, and thus with said input analog signal.

3. The ADC of claim 1, wherein said sigma-delta modulator is synchronized to the clock output.

4. The ADC of claim 3, said output circuit comprising a counter which alternates output states in response to counting up to a predetermined amount, said counter being connected to count up in response to said clock output when said clock output is selectively applied to the counter's input, and to count up in response to the sigma delta modulator output when said sigma delta modulator output is selectively applied to the counter's input.

5. The ADC of claim 1, said modulating circuit having a one-line output line for said digital output.

6. The ADC of claim 5, further comprising a receiver that is connected to receive said output signal at a location remote from said clock and modulating circuit, said receiver responding to the duty cycle of said output signal.

7. The ADC of claim 1, further comprising a transducer for sensing a physical phenomenon and producing said input analog signal in response thereto as an analog voltage signal, said transducer being connected to apply said voltage as an input to said modulating circuit.

8. The ADC of claim 7, said transducer comprising a temperature sensor.

9. The ADC of claim 1, wherein said clock and modulating circuit are integrated together on a common integrated circuit chip.

10. A circuit for converting an analog input signal to an output digital signal whose duty cycle represents said input signal, comprising:

a two-phase clock circuit having first and second complementary outputs, a sigma-delta modulator that is connected to receive said analog input signal and is synchronized to said complementary clock outputs, and produces in response thereto an output pulsed signal whose duty cycle varies with the analog input signal, and a counter circuit having an input that is connected to receive the sigma-delta modulator output when a predetermined higher order counter bit is in one digital state, and to receive one of the clock outputs when said predetermined counter bit is in the opposite digital state, the counter producing a digital output that alternates between complementary digital states, with the duration of the counter output in one state varying as a function of the clock frequency and in the other state as a function of the duty cycle of the sigma-delta modulator output.

11. The circuit of claim 10, wherein said sigma-delta modulator produces an output that alternates between two states and is synchronized to said clock outputs so that it produces output pulses in one of said states with durations equal to the durations of the complementary outputs from said clock circuit.

12. The circuit of claim 11, wherein the output frequency of said clock circuit can vary with temperature.

13. The circuit of claim 10, wherein said counter circuit produces a digital output with a duty cycle that represents the average duty cycle of the sigma-delta modulator output.

14. The circuit of claim 13, wherein said counter input is connected through a multiplexer circuit to receive the sigma-delta modulator output and said clock output, such that the duty cycle of the counter circuit's output varies in proportion to the average duty cycle of the sigma-delta modulator output.

15. The circuit of claim 10, wherein said counter circuit produces its digital output on a one-line output line.

16. The circuit of claim 10, wherein said clock circuit, sigma-delta modulator and counter circuit are integrated together on a common integrated circuit chip.

* * * * *